United States Patent
Mei et al.

(10) Patent No.: US 10,862,039 B2
(45) Date of Patent: Dec. 8, 2020

(54) METHODS AND COMPOSITIONS FOR ENHANCING PROCESSABILITY AND CHARGE TRANSPORT OF POLYMER SEMICONDUCTORS AND DEVICES MADE THEREFROM

(71) Applicant: Purdue Research Foundation, West Lafayette, IN (US)

(72) Inventors: Jianguo Mei, West Lafayette, IN (US); Yan Zhao, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 16 days.

(21) Appl. No.: 16/034,043

(22) Filed: Jul. 12, 2018

(65) Prior Publication Data

US 2018/0331294 A1 Nov. 15, 2018

Related U.S. Application Data

(62) Division of application No. 15/045,953, filed on Feb. 17, 2016, now Pat. No. 10,026,898.

(60) Provisional application No. 62/117,624, filed on Feb. 18, 2015.

(51) Int. Cl.
*H01L 51/00* (2006.01)
*C08G 61/12* (2006.01)
*H01L 51/05* (2006.01)

(52) U.S. Cl.
CPC ........ *H01L 51/0036* (2013.01); *C08G 61/124* (2013.01); *C08G 61/126* (2013.01); *H01L 51/0043* (2013.01); *C08G 2261/122* (2013.01); *C08G 2261/20* (2013.01); *C08G 2261/3223* (2013.01); *C08G 2261/334* (2013.01); *C08G 2261/3326* (2013.01); *C08G 2261/344* (2013.01); *C08G 2261/364* (2013.01); *C08G 2261/414* (2013.01); *C08G 2261/51* (2013.01); *C08G 2261/92* (2013.01); *H01L 51/0003* (2013.01); *H01L 51/0558* (2013.01); *Y02E 10/549* (2013.01); *Y02P 70/521* (2015.11)

(58) Field of Classification Search
CPC .................................................. H01L 51/0036
See application file for complete search history.

(56) References Cited

U.S. PATENT DOCUMENTS

| | | | |
|---|---|---|---|
| 7,279,702 B2* | 10/2007 | Huisman | C08G 61/02 257/40 |
| 2007/0272917 A1* | 11/2007 | Cupertino | H01L 51/0035 257/40 |
| 2009/0152531 A1* | 6/2009 | Towns | C08G 61/02 257/40 |
| 2011/0114184 A1* | 5/2011 | Brown | C07D 487/04 136/263 |
| 2013/0075714 A1* | 3/2013 | Zuberi | H01L 51/0043 257/40 |

OTHER PUBLICATIONS

Gasperini et al. "Controlling conjugated polymer morphology and charge carrier transport with a flexible-linker approach" (Year: 2014).*
Mei et al. "Side Chain Engineering in Solution-Processable Conjugated Polymers" (Year: 2013).*

* cited by examiner

Primary Examiner — Austin Murata
(74) Attorney, Agent, or Firm — Purdue Research Foundation

(57) ABSTRACT

Methods of making solid-state semiconducting films. The methods include forming a mixture by mixing at least two monomers in a pre-determined proportion such that at least one of the at least two monomers contains at least one non-conjugation spacer. Polymerization of the mixture is achieved by reacting the monomers with one another resulting in a solid state polymer which is then purified. The purified solid state polymer is dissolved in an organic solvent to form a homogenous solution which is then deposited onto a substrate, forming a solid-state semiconducting film by evaporating the solvent. Alternatively, the purified solid state polymer is deposited onto a substrate and heated to form a liquid melt, and cooling the liquid melt results in a solid state semiconducting thin film. Also, films comprising a semiconducting polymer composition containing a minimum of one non-conjugation spacer and devices comprising such films.

3 Claims, 5 Drawing Sheets

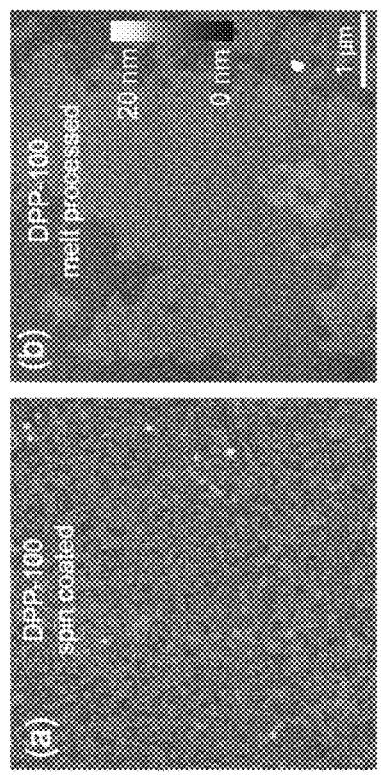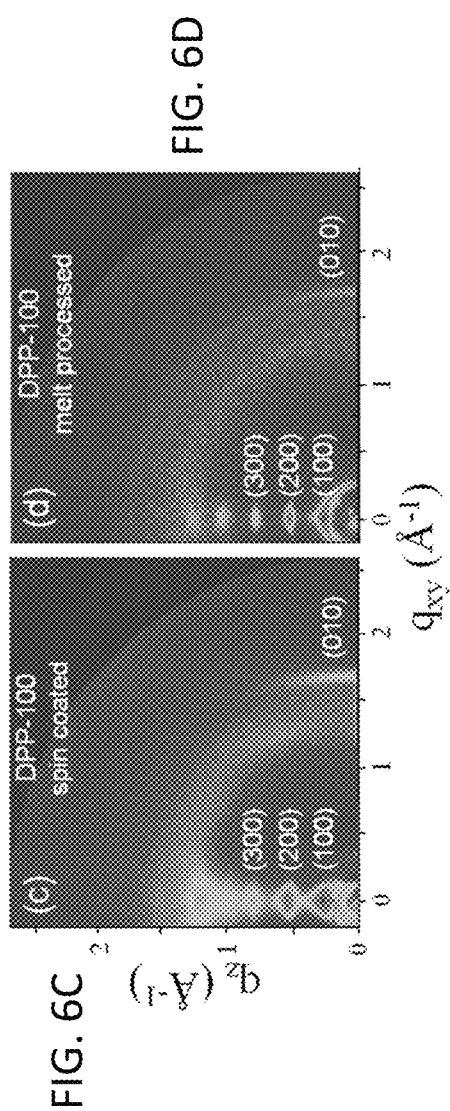
FIG. 6A FIG. 6B FIG. 6C FIG. 6D

METHODS AND COMPOSITIONS FOR ENHANCING PROCESSABILITY AND CHARGE TRANSPORT OF POLYMER SEMICONDUCTORS AND DEVICES MADE THEREFROM

CROSS-REFERENCE TO RELATED APPLICATIONS

The present U.S. patent application is a divisional application of co-pending U.S. patent application Ser. No. 15/045,953 filed Feb. 17, 2016, which claims the priority benefit of U.S. Provisional Patent Application Ser. No. 62/117,624 filed Feb. 18, 2015. The contents of these prior applications are hereby incorporated by reference in their entirety into the present disclosure.

TECHNICAL FIELD

The present disclosure generally relates to methods and compositions for enhancing processability and charge transport of polymer semiconductors.

BACKGROUND

This section introduces aspects that may help facilitate a better understanding of the disclosure. Accordingly, these statements are to be read in this light and are not to be understood as admissions about what is or is not prior art.

Conjugated polymers are promising optoelectronic materials for next-generation flexible and printed electronics. Conjugated polymers are a class of polymers with delocalized π-orbitals along the polymer backbone. Extensive efforts have been put into the design and synthesis of conjugated polymers. A plethora of knowledge about how to rationally control their optical, electronic, and redox properties has been realized in the development of numerous conjugated polymers. In contrast, partially-conjugated semiconducting polymers with intentionally-placed, non-conjugated flexible linkages that allow conformation freedom along the polymer backbones have received little attention. There are two primary reasons. First, flexible linkages create high degrees of conformational and energetic disorder in polymer chains. Second, conjugation-break spacers (CBSs) disrupt the extended π-electron delocalization along polymer backbones. Conjugation-break spacers, also called non-conjugated spacers or non-conjugation spacers or non-conjugal spacers, are chemical groups that do not present pi-conjugation along the polymer backbone and connect two conjugated moieties through covalent bonds. In principle, both factors can have a negative influence on electronic properties, particularly for charge transport. On the other hand, high performance conjugated polymers are often plagued with poor solution-processability, a leading factor for batch-to-batch variations in both polymer synthesis and device fabrication. This limits applications of conjugated polymers in large scale flexible electronics. Conventionally, tuning solution-processability of polymers in organic solvents can be achieved by changing the size and shape of flexible solubilizing chains attached to polymer backbones. However, the modulation of polymer solution-processability and electronic performance turns out to be nontrivial as the factors that determine processability and electronic properties are incompatible. It should be noted that solution-processability is a term used to describe the desirable characteristics of the solution, namely adequate solubility of the polymer in this solvent, ability to make the solution as homogeneous as possible in terms the polymer concentration, and the ability of the solution to lend itself to depositing methods that provide uniform thickness and physical properties for films made from the solution.

Currently chlorinated solvents are utilized as solvents for polymer semiconductor materials for solution processing. These solvents are toxic. Further the existing polymer semiconductors do not lend themselves to melt-processing. Further, the existing polymer semiconductors do not lend themselves extrusion and lamination processing.

For the forgoing reasons, there exists a need for environmentally friendly approaches that can be applied to conjugated polymers to enhance their solution-processability as well as lending other types of processability for the conjugated polymers making them into useful polymer semiconductors for electronic and optoelectronic applications. Further there is need for melt processable polymers and polymers that lend themselves to extrusion and lamination processing.

SUMMARY

A method of making solid-state semiconducting films using a semiconducting polymer with enhanced solution processability is disclosed. The method includes forming a mixture by mixing at least two monomers in a pre-determined proportion, wherein at least one of the at least two monomers contains at least one non-conjugation spacer; achieving polymerization of the mixture by reacting the at least two monomers with one another resulting in a solid state polymer; purifying the solid state polymer resulting in a quantity of purified solid state polymer; dissolving the quantity of the purified solid state polymer in an organic solvent to form a homogenous solution; depositing the homogenous solution onto a substrate; and evaporating the solvent to form a solid-state semiconducting film.

A semiconducting polymer composition is disclosed. The composition includes comprising at least two monomers in a pre-determined proportion, wherein at least one of the at least two monomers contains at least one non-conjugation spacer.

A method of making a solid state semiconducting films using a semiconducting polymer with melt processability is disclosed. The method includes mixing at least two monomers in a pre-determined proportion, wherein at least one of the two monomers contains at least one non-conjugation spacer, to form a mixture; achieving polymerization of the mixture by reacting the at least three monomers with one another resulting in a solid state polymer; purifying the solid state polymer resulting in a quantity purified solid state polymer; depositing the purified solid state polymer onto a substrate; heating the deposited purified solid state polymer to form a liquid melt; and cooling the liquid melt to result in a solid state semiconducting thin film.

Also disclosed are devices containing films made from a semiconducting polymer composition comprising at least two monomers in a pre-determined proportion, wherein at least one of the at least two monomers contains at least one non-conjugation spacer.

BRIEF DESCRIPTION OF DRAWINGS

While some of the figures shown herein may have been generated from scaled drawings or from photographs that are scalable, it is understood that such relative scaling within a figure are by way of example, and are not to be construed as limiting.

FIG. 6A is an AFM images of a spin coated DPP-100 film.

FIG. 6B is an AFM images of a melt processed DPP-100 film.

FIG. 6C is a GIXRD pattern for spin coated DPP-100 film.

FIG. 6D is a GIXRD pattern for melt processed DPP-100 film

DETAILED DESCRIPTION

Figure 1:
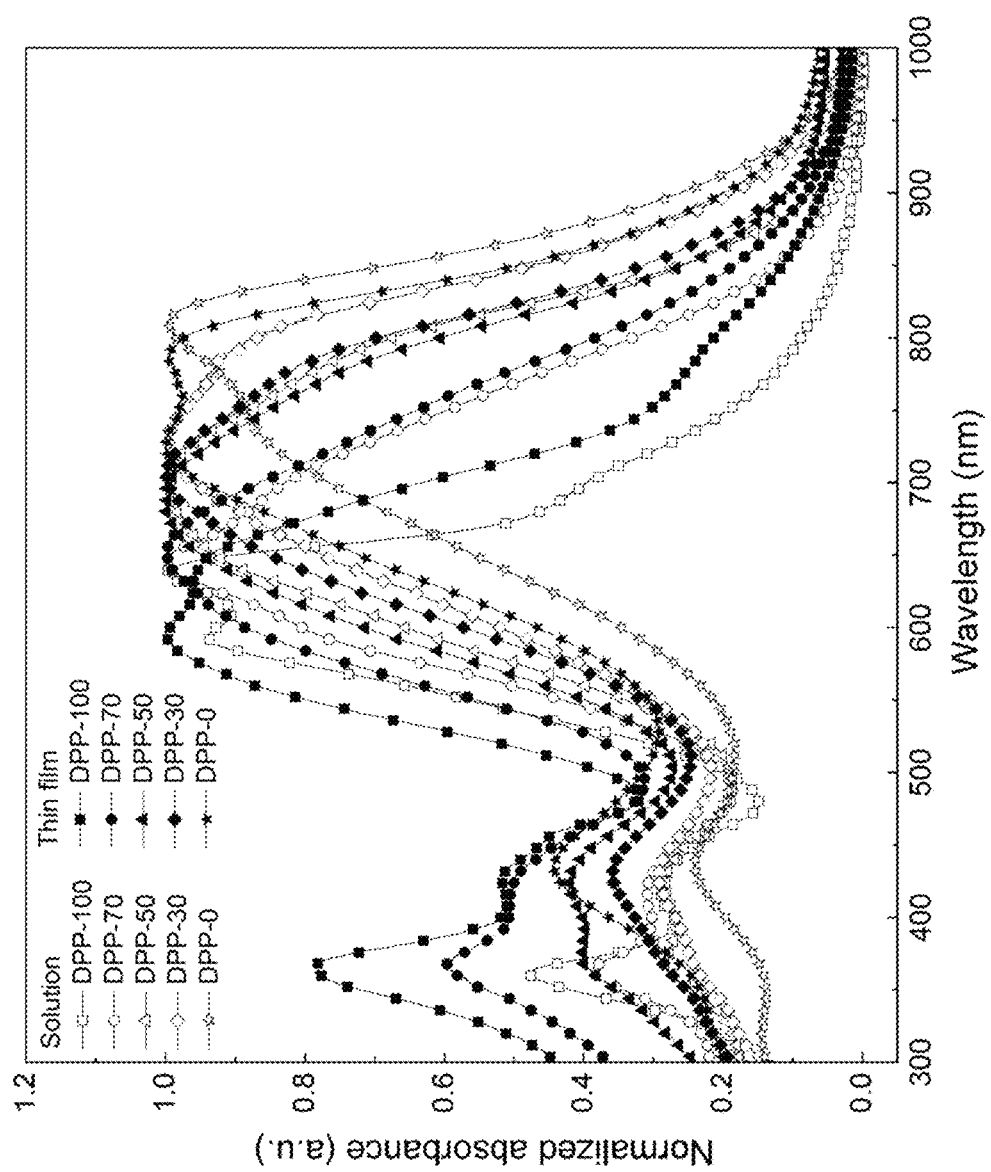
FIG. 1 shows UV-Vis-NIR spectra of DPP-100, DPP-70, DPP-50, DPP-30 and DPP-0 in solutions and as thin films.

For the purposes of promoting an understanding of the principles of the disclosure, reference will now be made to the embodiments illustrated in the drawings and specific language will be used to describe the same. It will nevertheless be understood that no limitation of the scope of the disclosure is thereby intended, such alterations and further modifications in the illustrated device, and such further applications of the principles of the disclosure as illustrated therein being contemplated as would normally occur to one skilled in the art to which the disclosure relates.

In this disclosure, we report a novel strategy to address the problem of thin film processing through molecular design. The strategy is to introduce flexible CBSs into conjugated backbones. As mentioned earlier, conjugation-break spacers are chemical groups that do not present pi-conjugation along the polymer backbone and connect two conjugated moieties through covalent bonds. In this disclosure conjugation-break spacers are also referred to as called non-conjugated spacers or non-conjugation spacers or non-conjugal spacers. Thus in this disclosure, the terms "conjugation-break spacers", "non-conjugated spacers", "non-conjugation spacers", and "non-conjugal spacers are used interchangeably and are considered synonymous. As will be demonstrated, this strategy not only provides a facile approach to modulate solution-processability of the polymers, but it also unexpectedly offers a promising strategy to prepare melt-processable semiconducting polymers. The former would make solution-processing more controllable. The latter could potentially eliminate the need for toxic organic solvents for thin-film formation, which would have a positive impact on both economic and environmental aspects. Understanding charge transport in disordered polymer films is a grand challenge in the field, as it plays a crucial role in next-generation semiconducting polymer designs and processes. This approach also provides a new platform for fundamental studies on charge transport from a different perspective.

Diketopyrrolopyrrole (DPP)-based semiconducting polymers have been extensively investigated for their charge transport properties. In studies leading to this disclosure, the diketopyrrolopyrrole-quaterthiophene copolymer was chosen as parent polymer, and a propyl unit as a flexible CBS. The synthetic route for the DPP polymers is shown in Scheme 1., shown below:

Scheme 1.

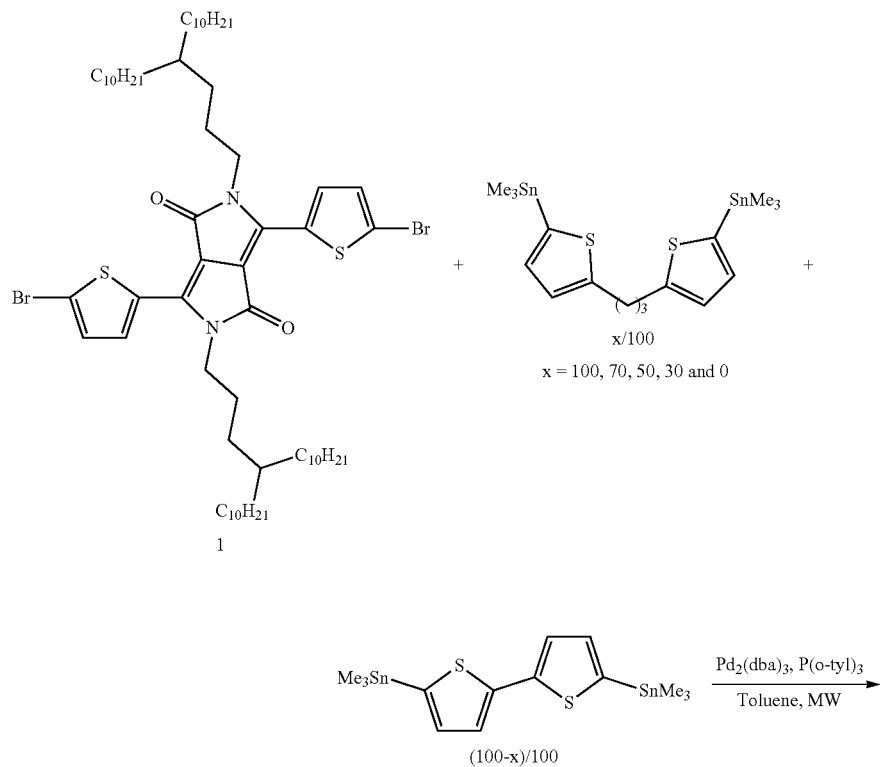

-continued

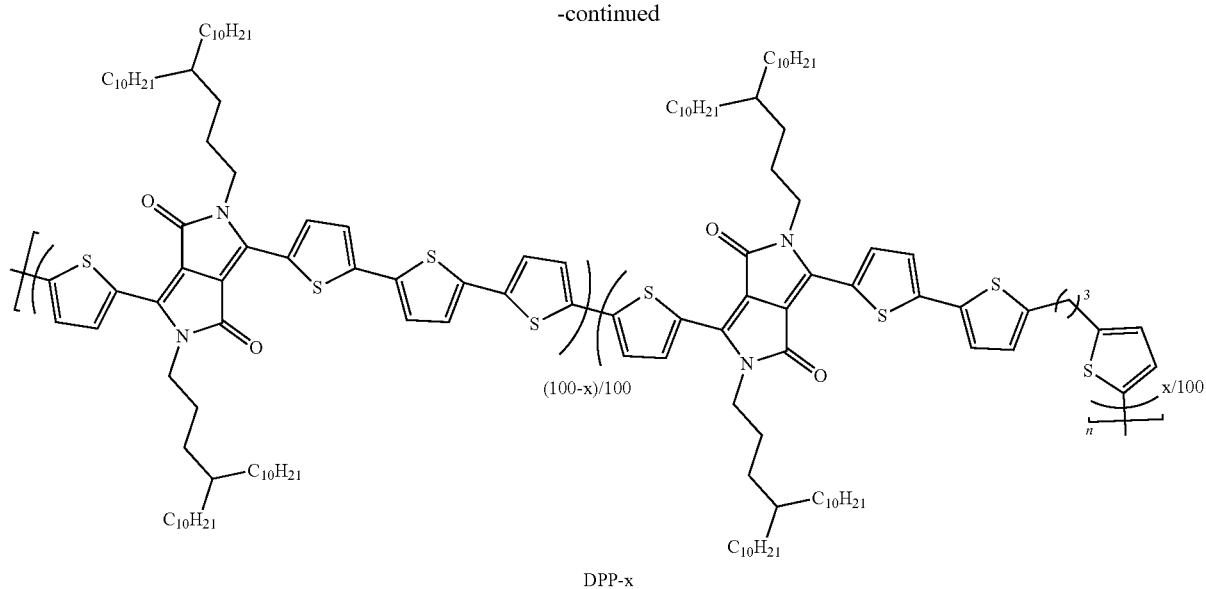

DPP-x

Pd$_2$(dba)$_3$ is tris(dibenzylideneacetone)dipalladium(0). P(o-tyl)3 is tri(o-tolyl)phosphine. MW means microwave. The physical characterization data of the monomers and polymers of the scheme 1 are summarized in Table 1 below.

DPP-50, DPP-30 and DPP-0 in solutions (dot) and as thin films (solid) are shown in FIG. 1. It is clear that the presence of CBS breaks the π-conjugation along the polymer backbone, thus making the spectra blue-shifting.

TABLE 1

Physical Properties of DPP polymers.

| | M$_n$(kDa)/PDI[a] | T$_d$[b] °C. | T$_m$[c] °C. | $\lambda_{max}^{abs}$ (nm) Solution[d] | $\lambda_{max}^{abs}$ (nm) Film[e] | $\lambda_{onset}^{abs}$ (nm) Film[e] | E$_g^{opt}$[f] (eV) | Energy levels (eV) E$_{HOMO}$[g] | Energy levels (eV) E$_{LUMO}$[h] |
|---|---|---|---|---|---|---|---|---|---|
| DPP-0 | 30.7/3.61 | 400 | — | 740, 811 | 725, 789 | 937 | 1.32 | −4.97 | −3.65 |
| DPP-30 | 23.0/3.24 | 400 | — | 729 | 708 | 925 | 1.34 | −5.01 | −3.67 |
| DPP-50 | 19.5/2.60 | 399 | — | 699 | 687 | 915 | 1.36 | −5.08 | −3.72 |
| DPP-70 | 16.9/2.20 | 395 | 270, 180 | 645 | 654 | 907 | 1.37 | −5.09 | −3.72 |
| DPP-100 | 12.5/1.98 | 390 | 180 | 594, 638 | 595, 637 | 887 | 1.40 | −5.13 | −3.73 |

[a]Trichlorobenzene as the eluent at 180° C.
[b]Decomposition temperature.
[c]Melting temperature.
[d]In dichlorobenzene solution.
[e]Spin-coated films on glass substrates, annealed at 150° C.
[f]Calculated from the onset absorption E$_g^{opt}$ = 1240/$\lambda_{onset}^{abs}$ (nm).
[g]Obtained from UPS.
[h]Calculated using the equation E$_{LUMO}$ = E$_{HOMO}$ + E$_g^{opt}$.

In Table 1 above, M$_n$ is the number average molecular weight. kDa is kilodalton. PDI is polydispersity index. Td is decomposition temperature and T$_m$ is melting temperature. $\lambda_{max}^{abs}$ is the wavelength at maximum absorption and $\lambda_{onset}^{abs}$ is the onset absorption wavelength. E$_g^{opt}$ is the energy band gap calculated from optical measurement. HOMO stands for the highest occupied molecular orbital and LUMO stands for the lowest unoccupied molecular orbital.

In the studies leading to this disclosure, ratio of the CBS is varied from 100%, 70%, 50%, 30% to 0%, namely from being fully flexible (DPP-100) to being fully rigid (DPP-0). The incorporation of propyl linkage was confirmed by monitoring the ratio between the number of protons in the CH$_2$ next to thiophene ring (chemical shift of ~2.9 ppm) and the number of protons the CH$_2$ unit next to nitrogen atom (chemical shift ~4.0 ppm) in a nuclear magnetic resonance (NMR) study. UV-Vis-NIR spectra of DPP-100, DPP-70, The number-average molar mass and polydispersity were evaluated by high temperature gel permeation chromatography (GPC) using trichlorobenzene as the eluent at 180° C. and polystyrene for calibration. The number-average molecular weights are 30.7, 23.0, 19.5, 16.9, and 12.5 kDa for DPP-100, DPP-70, DPP-50, DPP-30 and DPP-0, with the polydispersities of 3.61, 3.24, 2.60, 2.20, and 1.98, respectively. The difference in molecular weights for this set of polymers can be explained by the degree of deviation from the random-coil model, which is the basis for the universal calibration in the GPC measurement. The less CBSs the polymers contain, the more we expect a deviation from the random-coil model for the polymers.

The thermal stability for DPP polymers was evaluated by thermal gravimetric analysis (TGA). The decomposition temperatures are in the range of 390-400° C. Based on the weight loss information, it is believed that the decomposition starts from the loss of alkyl chains on the nitrogen atoms. Differential scanning calorimetry (DSC) analysis was carried out to obtain phase transition information. No noticeable thermal transition is observed in the range from 100 to 350° C. for DPP-0, 30 and 50, while DPP-70 and DPP-100 exhibit melting transitions around 270° C. and 180° C., respectively. The melting transitions of DPP-70 and DPP-100 are not reversible even with a scanning rate as low as 1° C./min. Upon heating and cooling on a hotplate, the polymers exhibit a reversible phenomenon of liquidation and solidification.

The solution and solid-state UV-Vis-NIR spectra of DPP polymers reveal the impact of propyl CBS on the optical properties, as summarized in Table 1. Referring to FIG. 1, a bathochromic (moving towards longer wavelength) shift is observed in both dichlorobenzene solutions and thin-films for this set of polymers (FIG. 1), due to the extension of conjugation along the polymer backbone from DPP-100 to DPP-0. From solution to thin film, DPP-0, DPP-30 and DPP-50 exhibit a clear hypochromic shift, whereas DPP-70 and DPP-100 show a limited bathochromic shift with an obvious spectral broadening. It is noted that a broad absorption emerges around 800 nm in the DPP-100 thin film, indicating the formation of strong excitonic interactions and the formation of π-stacks. The HOMO energy levels of the polymers are in the range of −4.97 and −5.13 eV, estimated by ultraviolet photoemission spectroscopy (UPS) and shown in Table 1. The difference in the HOMO levels for DPP-0 and DPP-100 is about 0.16 eV. And the difference is even smaller for the LUMO energy levels, only about 0.08 eV. It suggests that the LUMO level is more localized in a good agreement with the theoretical calculation.

The introduction of CBSs into conjugated backbones improves polymer solution-processability as a result of disrupting of backbone rigidity and inducing higher conformational freedom in solution. Indeed, the solubilities of these polymers in common organic solvents progressively increase with the percentage of CBSs. For instance, DPP-30 exhibits much improved solubility in dichlorobenzene about ~10 mg/mL, in comparison with that of DPP-0 (~3 mg/mL). Fully flexible DPP-100 shows solubility greater than 50 mg/mL under the same conditions. On the other hand, it is understood that the gain in solubility will be accompanied by the loss in charge transport performance, because the presence of CBSs disrupts the efficient intrachain charge transport pathway.

To investigate the influence of CBSs on the charge transport properties of these polymers, bottom-gate, bottom-contact organic field-effect transistors (OFETs) were fabricated with silicon wafers as the back gate electrode, a 300 nm thermally oxidized $SiO_2$ layer as the gate dielectric, and pre-patterned gold electrodes as the source/drain. Passivation of the $SiO_2$ layer was achieved by treating its surface with octadecyltrichlorosilane (OTS). All mobility values reported here were extracted from the electrical characteristics to ensure a fair assessment. Spin coated, drop-cast and melt-processed OFETs were fabricated and optimized. The device characteristics are summarized in Table 2 below.

TABLE 2

Field-effect performance characteristics of OFETs fabricated by different processing methods.

| | Spin coating | | | | Drop casting | | | | Melt processing | | | |
|---|---|---|---|---|---|---|---|---|---|---|---|---|
| | $\mu_{max}$ $cm^2/Vs$ | $\mu_{ave}$ $cm^2/Vs$ | $V_{Th}$ V | $I_{on}/I_{off}$ | $\mu_{max}$ $cm^2/Vs$ | $\mu_{ave}$ $cm^2/Vs$ | $V_{Th}$ V | $I_{on}/I_{off}$ | $\mu_{max}$ $cm^2/Vs$ | $\mu_{ave}$ $cm^2/Vs$ | $V_{Th}$ V | $I_{on}/I_{off}$ |
| DPP-0 | 4.27 | 3.52 | −4.9 | ~$10^6$ | 4.85 | 4.28 | −4.3 | ~$10^6$ | — | — | — | — |
| DPP-30 | 1.43 | 0.91 | −4.3 | ~$10^6$ | 1.44 | 1.05 | −4.6 | ~$10^6$ | — | — | — | — |
| DPP-50 | 0.44 | 0.27 | −5.5 | ~$10^5$ | 0.46 | 0.19 | −6.1 | ~$10^5$ | — | — | — | — |
| DPP-70 | 0.091 | 0.065 | −7.9 | ~$10^5$ | 0.095 | 0.069 | −7.4 | ~$10^5$ | 0.30 | 0.21 | −4.3 | ~$10^5$ |
| DPP-100 | 0.026 | 0.014 | −9.2 | ~$10^4$ | 0.027 | 0.016 | −8.6 | ~$10^5$ | 0.045 | 0.032 | −4.5 | ~$10^5$ |

Figure 2B:
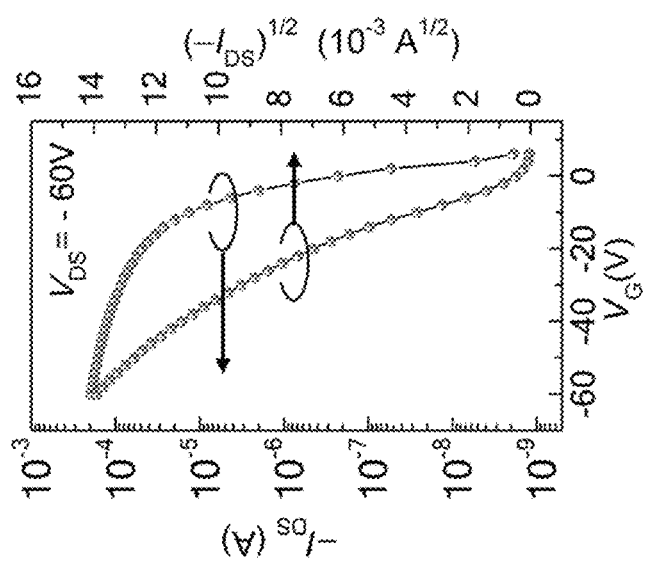
FIG. 2B shows Output characteristic of spin coated DPP-30 OFETs.
Figure 2A:
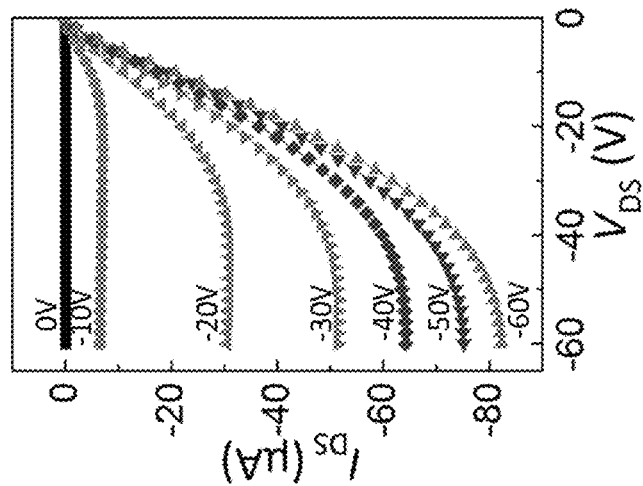
FIG. 2A shows transfer characteristic of spin coated DPP-30 OFETs.

Referring to Table 2, for devices fabricated by spin coating from dichlorobenzene solution and annealed in vacuum at 150° C., DPP-0 exhibited the maximum hole mobility of 4.27 $cm^2 \cdot V^{-1} s^{-1}$, with an average mobility of 3.52 $cm^2 \cdot V^{-1} s^{-1}$. These results are in line with other reported DPP-based OFETs. With 30% CBSs along the polymer backbone, DPP-30 surprisingly presented the mobility up to 1.43 $cm^2 \cdot V^{-1} s^{-1}$ over the benchmark value (1 $cm^2 \cdot V^{-1} s^{-1}$) for high performance polymers. The representative transfer and output curves of DPP-30 are shown in FIGS. 2A and 2B. High hole mobility of up to 4.27 $cm^2 \cdot V^{-1} s^{-1}$ in the saturation regime, well defined on/off current states with on/off current ratio higher than $10^6$ were obtained, indicating good OFET performance.

Figure 3:
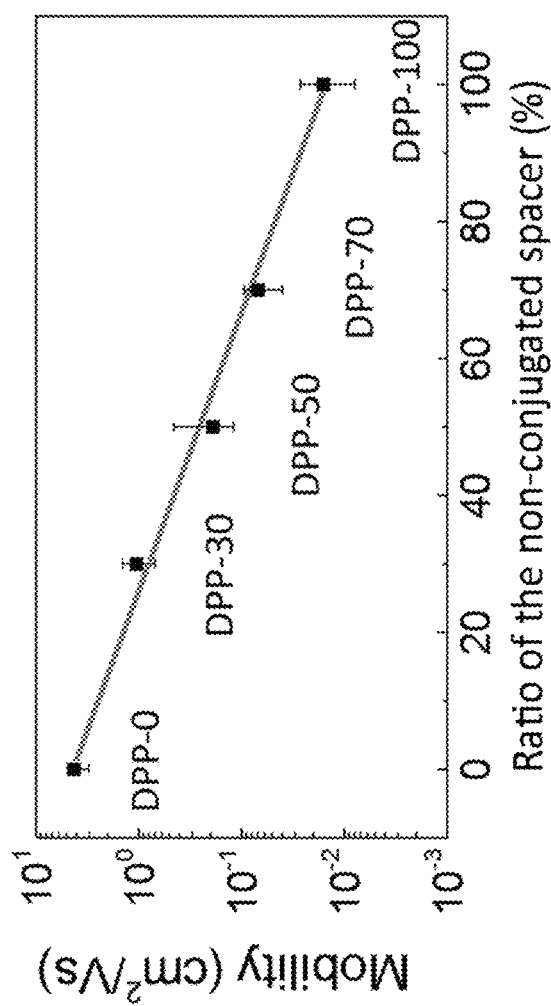
FIG. 3 shows the correlation between the mobility and the conjugation break spacer ratio obtained from the study on five polymers, namely, DPP-100, DPP-70, DPP-50, DPP-30 and DPP-0.
Figure 5:
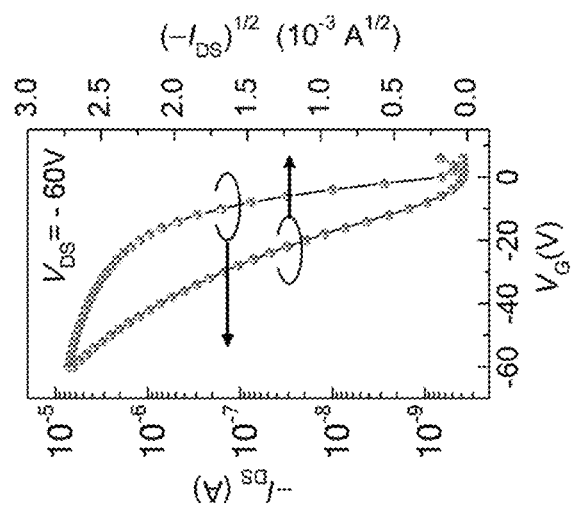
FIG. 5 shows transfer characteristic of melt processed DPP-100 OFETs.
Figure 4:
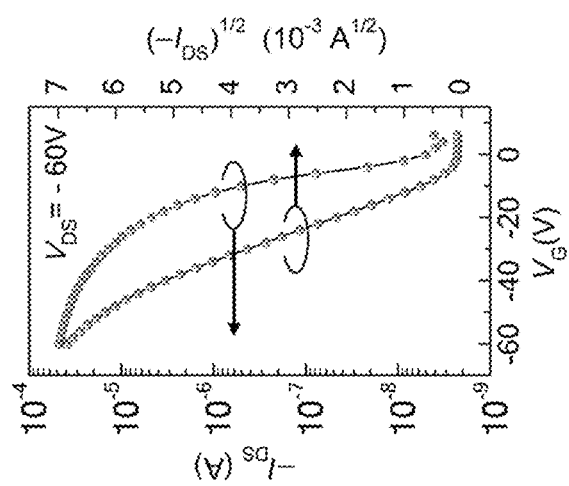
FIG. 4 shows transfer characteristic of melt processed DPP-70 OFETs.

With the increasing of CBSs in the polymer backbone, charge carrier motilities of DPP-50, DPP-70 and DPP-100 predictably fell. With over one hundred devices for each polymer measured, it was found that the logarithmic mobility is nearly proportional to the CBS ratio in an inverse manner, as shown in FIG. 3, which shows the correlation between the mobility and the conjugation break spacer ratio obtained from the study on five polymers, namely, DPP-100, DPP-70, DPP-50, DPP-30 and DPP-0.

In conjunction with the solubility improvement, it was demonstrated that polymer mobility and solubility could be modulated through the introduction of CBSs. In other words, a fine balance between performance and processability can be reached based on needs. The present approach of introducing CBSs into semiconducting polymers will likely play a significant role in practical applications. Drop-cast devices provided similar results, as shown in Table 2. Annealing of the devices at 150° C. in air on a hot plate was also carried out and the results indicated that the transistor devices, made from these polymers, namely DPP-100, DPP-70, DPP-50, DPP-30 and DPP-0, have excellent thermal stability in air. The semiconductor layer was deposited on the OTS-treated $Si/SiO_2$ substrates by spin coating and drop casting. For spin coating, spin speed of 2000 r.p.m. was used to get a good polymer film. The concentrations of the solutions used for spin coating were 3 mg/mL for polymer DPP-0 and 10 mg/mL for the other 4 polymers. The concentrations of the solutions used for drop casting is ⅓ of those for spin coating.

From DSC studies it was learned that melting transitions exist in DPP-70 and DPP-100. Further devices made using DPP-70 and DPP-100 were stable in air from the annealing study. It was hence inferred that these polymers will be suitable for the melt processing, a process widely practiced for making plastic thin films in industry. We fabricated the melt processed OFETs by directly placing DPP-70 and DPP-100 solids on the pre-patterned, OTS-treated silicon wafer, which was then subjected to 250° C. and 200° C. in air (with/without nitrogen flow protection), respectively. Performance characteristics of devices using melt-processed DPP-70 and DPP-100 are summarized in Table 2. The motilities are as high as 0.30 and 0.045 cm$^2 \cdot$V$^{-1}$s$^{-1}$ for DPP-70 and DPP-100, which are two or three times that of the ones processed through solution processing. Compared to solution processing methods, melt processing completely eliminates the need of using toxic organic solvents.

To understand the correlation between microstructure and transistor performance, atomic force microscope (AFM) and grazing incidence X-ray diffraction (GIXRD) studies were performed on both spin-coated and melt-processed thin films on OTS-covered Si/SiO$_2$ substrates. The AFM study revealed unusual lamellar (layered) microstructures across the spin-coated films for polymers with higher ratio of CBSs (DPP-70 and DPP-100). Each layer was about ~2.2-2.4 nm thick, which is close to the lamellar spacing for the polymers. In comparison, DPP-0, DPP-30 and DPP-50 exhibit very similar morphologies as often seen in conjugated polymers, and no layered packing is present. Layered microstructures are often found in highly crystalline small molecule thin films but rarely observed in semiconducting polymer thin films. This observation suggests DPP-70 and DPP-100 may resemble small molecules in a way that high crystallinity is preserved, particularly in their melt processed thin films. Increased degree of ordering observed from AFM results is corroborated by GIXRD studies. All spin-coated polymer thin films exhibit a dominant edge-on π-π stacking, favourable for charge transport.

With the increase of the CBS ratio, the full-width half maximum (FWHM) of both the lamellar and π-π stacking peaks in spin-coated films is reduced by approximately 25% from DPP-0 to DPP-100 as shown in Table 3 below:

TABLE 3

Crystallographic Parameters for the spin coated DPP Polymer Films by GIXRD.

| | DPP-0 | DPP-30 | DPP-50 | DPP-70 | DPP-100 |
|---|---|---|---|---|---|
| lamella spacing (Å) | 22.28 | 22.07 | 21.96 | 21.75 | 21.64 |
| lamella peak FWHM (1/Å) | 0.044 | 0.038 | 0.039 | 0.041 | 0.035 |
| π-π stacking distance (Å) | 3.62 | 3.64 | 3.65 | 3.65 | 3.62 |
| π-π peak FWHM (1/Å) | 0.084 | 0.078 | 0.087 | 0.076 | 0.063 |

The above observation indicates that the crystalline domains become more ordered with the increased fraction of spacers, in line with the AFM observations. Application of models from literature on the lamellar stacking peaks yields the apparent crystalline domain coherent length of 14 nm and 18 nm for DPP-0 and DPP-100, respectively. In addition to the change in FWHM, the lamellar stacking distance consistently decreases from DPP-0 to DPP-100, albeit slightly, which could be due to closer alkyl chain stacking with increased molecular ordering.

AFM images and GIXRD patterns of DPP-100 by spin-coated and melt-processed thin films are shown in FIGS. 6A through 6D. A striking difference is observed in AFM images. The melt processed film forms condensed layered microstructures, while the spin-coated film exhibits loosely packed layers. The GIXRD patterns reveal considerably sharper peaks with a dramatically reduced peak width for the melt-processed film, suggesting that much larger domains and/or significantly improved ordering existed in the melt processed thin films. It is worth noting that such narrow peak widths (0.012~0.016 A$^{-1}$) and large apparent domain sizes (40~50 nm) are not common among polymer materials. A similar observation is also found in the case of DPP-70. Both AFM and GIXRD results strongly support that melt processed films have more ordered microstructures and packing motifs for charge transport than solution processed films, which is in good agreement with the OFET result that melt-processed devices displayed improved charge transport characteristics versus solution-processed devices.

Understanding how charge carriers move in the thin film is a critical step to design next generation semiconducting polymers. From high molecular weight tie chain model to disorder-free transport model, there is much to investigate about charge transport in semiconducting polymer thin films. Our present disclosure provides fresh insights into these charge transport models. For instance, DPP-100, having 100% flexible CBSs along the polymer backbone, obviously lacks intrachain charge transport pathways. Despite the presence of highly ordered π-stacks, the mobility from DPP-100 is about two order magnitude lower than that of DPP-0. This observation clearly underscores the importance of intrachain charge transport and a torsion-free polymer backbone as proposed in a model in the literature. If a small amount of DPP-0 is blended into DPP-100 to serve as the tie chains, it is possible that there will be a dramatic increase in the charge transport of the blended film.

Thus, in this disclosure, the modulation of electronic performance and solution-processability in semiconducting polymers has been realized through introducing flexible conjugation-break spacers. This approach also leads to design of high performance melt-processable semiconducting polymers. Importantly, melt processed thin films present higher crystallinity and more ordered microstructures than their solution-processed counterparts, and hence offer substantially improved charge transport characteristics. These findings can lead to development of low cost melt-processed organic electronics via the industrially-adapted extrusion and lamination process. Higher performance melt-processable polymers are possible by those skilled in the art by extending the approaches described in this disclosure. Fine-tuning the flexible spacer length offers the potential to improve charge transport. It has been clearly demonstrated that introduction of flexible conjugation-break spacers (CBSs) into semiconducting polymers enables to modulate polymer processability and charge transport properties, as well as rendering melt-processability to the resulting polymers with the high CBS loading (≥3 Carbons in a chain, as understood by those skilled in the art), depending on the length of CBS.

In this disclosure, conjugation-break spacers (CBSs) are intentionally introduced into the diketopyrrolopyrrole (DPP)-based polymer backbones. It has been demonstrated in this disclosure demonstrated that the solution-processability progressively increases with the percentage of CBSs, while charge mobility inversely varies to the CBS ratio. For instance, the polymer DPP-30 with solubility of ~10 mg/mL in dichlorobenzene provides an average mobility over 1.4 cm$^2 \cdot$V$^{-1}$s$^{-1}$, while DPP-0 exhibits an average mobility of 4.3 cm$^2 \cdot$V$^{-1}$s$^{-1}$ with solubility of ~3 mg/ml. This correlation provides a general guidance to design polymers with desired electronic performance and solution-processability for large scale roll-to-roll processing. DPP-70 can be melt processed in air and provide hole mobilities up to 0.30 $cm^2 \cdot V^{-7}s^{-1}$, substantially higher value than their solution-processed counterparts about 0.1 $cm^2 \cdot V^{-1}s^{-1}$. The mobility boost in melt-processed devices, together with completely eliminating the need to use toxic solvent in the processing, enables designing melt-processable polymers for electronic devices.

Based on the above description, we can now describe a semiconducting polymer composition comprising at least one non-conjugation spacer. Further, the percentage of non-conjugation spacer, measured in mers, can be varied. In particular, we can have zero percentage (in terms of mers) of non-conjugation spacer and still achieve a semiconducting polymer. Further, it is possible to have a semiconducting polymer which is made of non-conjugation spacers only.

Based on the above description, a method of making solid-state semiconducting films using a semiconducting polymer with enhanced solution processability can be described. The method comprises mixing at least three monomers in a pre-determined proportion, wherein at least one of the three monomers contains at least one non-conjugation spacer, to form a mixture. The three monomers in the mixture are then reacted with one another to achieve polymerization, resulting in a solid state polymer. The solid state polymer is then purified as known to those skilled in the art. The purified solid state polymer is then dissolved into an organic solvent to form a homogenous solution. The homogeneous solution is then deposited onto a substrate. The solvent of the solution is then evaporated to form a solid-state semiconducting film.

In the above method, non-limiting examples of the three monomers are: 3,6-bis(5-bromothiophen-2-yl)-2,5-bis(4-decyltetradecyl)-2,5-dihydropyrrolo[3,4-c]pyrrole-1,4-dione; 3-bis(5-(trimethylstannyl)thiophen-2-yl)propane; and 5,5'-bis(trimethylstannyl)-2,2'-bithiophene. Non-limiting example of the solvent that can be used in this method are dichlorobenzene, chlorobenzene and toluene.

It is also an aspect of this disclosure to have at least one of the three monomers, namely (3,6-bis(5-bromothiophen-2-yl)-2,5-bis(4-decyltetradecyl)-2,5-dihydropyrrolo[3,4-c]pyrrole-1,4-dione; 1,3-bis(5-(trimethylstannyl)thiophen-2-yl)propane; and 5,5'-bis(trimethylstannyl)-2,2'-bithiophene) mentioned above contain at least one non-conjugal spacer. It is advantageous to have these three present in the ratio 1:x; (1−x), where x is the number of mers of monomer containing the non-conjugation spacer. For the polymerization it is required to have equal amount of reactive functional groups on the monomers to obtain polymers. Otherwise, low molecular weight oligomeric species will be obtained.

To achieve solid-state semiconducting films from the semiconducting polymers of this disclosure, several techniques or methods can be used for depositing the purified solid-state polymer onto a substrate. Non-limiting examples of deposition methods suitable for this purpose include spin-coating, drop-casting, ink-jet printing, and screen printing.

Many materials can be used as a substrate on which the polymer semiconducting films of this disclosure are deposited. Non-limiting examples of for the substrate in the methods described above include silicon wafer, indium-tin oxide, and various types of glass. Many methods can be used to achieve polymerization. One simple method is heating. One can use a catalyst to aid in the polymerization process during heating. A non-limiting examples of a catalyst that can be used for this purpose is palladium complex.

Based on the above detailed descriptions, we can also describe a method of making solid state semiconducting films using a semiconducting polymer with melt processability. In this case, the method comprises mixing at least three monomers in a pre-determined proportion, wherein at least one of the three monomers contains at least one non-conjugation spacer, to form a mixture, and achieving polymerization of the mixture by reacting the at least three monomers with one another resulting in a solid state polymer. The solid state polymer is then purified as described by methods known to those skilled in the art, resulting in a quantity of purified solid state polymer. The purified solid state polymer is then deposited onto a substrate and heated to form a liquid melt. The liquid melt is then cooled resulting in a solid state semiconducting thin film.

In the method described above to make a solid state semiconducting films using a semiconducting polymer with melt processability, non-limiting examples of the at least three monomers are 3,6-bis(5-bromothiophen-2-yl)-2,5-bis(4-decyltetradecyl)-2,5-dihydropyrrolo[3,4-c]pyrrole-1,4-dione; 1,3-bis(5-(trimethylstannyl)thiophen-2-yl)propane; 5,5'-bis(trimethylstannyl)-2,2'-bithiophene, wherein 1,3-bis(5-(trimethylstannyl)thiophen-2-yl) propane contains at least one non-conjugal spacer. It is advantageous to have the mers ratio of 3,6-bis(5-bromothiophen-2-yl)-2,5-bis(4-decyltetradecyl)-2,5-dihydropyrrolo[3,4-c]pyrrole-1,4-dione; 1,3-bis(5-(trimethylstannyl)thiophen-2-yl)propane; and 5,5'-bis(trimethylstannyl)-2,2'-bithiophene to be 1:x:(1−x) wherein x is the number of mers of 1,3-bis(5-(trimethylstannyl)thiophen-2-yl)propane. For the polymerization, it is required to have equal amount of reactive functional groups on the monomers to obtain polymers. Otherwise, low molecular weight oligomeric species will be obtained. Further, in this method, it should be noted that many materials can be used a substrate on which the purified silid state polymer is deposited. Non-limiting examples of such a substrate include silicon wafer, indium-tin oxide, and various types of glass.

While the above description described methods of making semiconducting films using at least three monomers, of which at least at least one of the three monomers contains at least one non-conjugation spacer, it is possible to make polymer semiconducting films using at least two monomers. In the case of using only two monomers, one of them should contain at least one non-conjugation spacer. This case corresponds to x=100 in Scheme 1. In such a case, flexibility of using different types of polymers is compromised, limiting the approach to alternating type co-polymers only.

Semiconducting polymers (namely conjugated polymers) are promising optoelectronic materials for next-generation flexible and printed electronics, including organic solar cells (OPVs), organic field-effect transistors (OFETs), organic light-emitting diodes (OLEDs), and electrochromic devices, among others. These polymers are typically processed by organic solvents. At present, however, numerous high performance conjugated polymers encounter the solubility problem, so that they have to be processed in chlorinated solvents under high temperatures. The methods and compositions described in this disclosure can be used advantageously to develop a new class of polymers that exhibit much enhanced solution-processability. More importantly, these carefully designed polymers enable melt-processing, thus making fabrication of plastic electronics possible via the extrusion and lamination process for the electronic applications mentioned above and many other applications.

The foregoing discussion shows that the methods and compositions of this disclosure dramatically improve solubility for the polymers, and make solution-processing possible under ambient conditions and using less toxic solvents. Further, the high performance melt-processable semiconducting polymers described in this disclosure can enable more environmentally-friendly processes and lower costs.

While the present disclosure has been described with reference to certain embodiments, it will be apparent to those of ordinary skill in the art that other embodiments and implementations are possible that are within the scope of the present disclosure without departing from the spirit and scope of the present disclosure. Thus, the implementations should not be limited to the particular limitations described. Other implementations may be possible. It is therefore intended that the foregoing detailed description be regarded as illustrative rather than limiting. Thus, this disclosure is limited only by the following claims.

The invention claimed is:

1. A semiconducting polymer composition comprising three monomers in a pre-determined proportion, wherein the three monomers are 3,6-bis(5-bromothiophen-2-yl)-2,5-bis(4-decyltetradecyl)-2,5-dihydropyrrolo[3,4-c]pyrrole-1,4-dione; 1,3-bis(5-(trimethylstannyl)thiophen-2-yl)propane; and 5,5'-bis(trimethylstannyl)-2,2'-bithiophene, wherein 1,3-bis(5-(trimethylstannyl)thiophen-2-yl)propane contains at least one non-conjugation spacer.

2. The composition of claim 1, wherein the 3,6-bis(5-bromothiophen-2-yl)-2,5-bis(4-decyltetradecyl)-2,5-dihydropyrrolo[3,4-c]pyrrole-1,4-dione; 1,3-bis(5-(trimethylstannyl)thiophen-2-yl)propane; and 5,5'-bis(trimethylstannyl)-2,2'-bithiophene are in the mer ratio of: 1:x:(1-x), wherein x is the number of mers of 1,3-bis(5-(trimethylstannyl)thiophen-2-yl)propane.

3. A semiconducting polymer composition comprising two monomers in a pre-determined proportion, wherein the two monomers are 3,6-bis(5-bromothiophen-2-yl)-2,5-bis(4-decyltetradecyl)-2,5-dihydropyrrolo[3,4-c]pyrrole-1,4-dione, and 1,3-bis(5-(trimethylstannyl)thiophen-2-yl)propane, wherein 1,3-bis(5-(trimethylstannyl)thiophen-2-yl)propane contains at least one non-conjugation spacer.

* * * * *